(12) United States Patent
Hemon et al.

(10) Patent No.: US 7,940,513 B2
(45) Date of Patent: May 10, 2011

(54) SWITCH ARRANGEMENT, INTEGRATED CIRCUIT, ACTIVATION SYSTEM

(75) Inventors: Erwan Hemon, Goyrans (FR); Thierry Laplagne, Cugnaux (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 412 days.

(21) Appl. No.: 11/996,241

(22) PCT Filed: Jul. 18, 2005

(86) PCT No.: PCT/EP2005/009176
§ 371 (c)(1),
(2), (4) Date: Jun. 27, 2008

(87) PCT Pub. No.: WO2007/009482
PCT Pub. Date: Jan. 25, 2007

(65) Prior Publication Data
US 2009/0115489 A1 May 7, 2009

(51) Int. Cl.
*F23Q 5/00* (2006.01)
(52) U.S. Cl. ............................................. 361/247
(58) Field of Classification Search ................ 361/247
See application file for complete search history.

(56) References Cited

U.S. PATENT DOCUMENTS

| | | | | |
|---|---|---|---|---|
| 5,596,497 A * | 1/1997 | Honda | | 701/45 |
| 5,929,535 A | 7/1999 | Fendt | | |
| 6,072,246 A * | 6/2000 | Schafer | | 307/10.1 |
| 6,191,625 B1 | 2/2001 | Wachter et al. | | |
| 6,216,070 B1 * | 4/2001 | Hayashi et al. | | 701/45 |
| 6,465,907 B2 * | 10/2002 | Ueno et al. | | 307/10.1 |
| 7,091,752 B2 * | 8/2006 | Balakrishnan | | 327/108 |
| 7,385,307 B2 | 6/2008 | Hemon et al. | | |
| 7,777,364 B2 | 8/2010 | Hemon et al. | | |
| 2004/0108698 A1 | 6/2004 | Rothleitner | | |
| 2004/0174005 A1 | 9/2004 | Shimizu | | |
| 2005/0079851 A1 * | 4/2005 | Derbyshire et al. | | 455/333 |
| 2005/0127755 A1 | 6/2005 | Aichriedler et al. | | |
| 2007/0102582 A1 | 5/2007 | Botura et al. | | |

FOREIGN PATENT DOCUMENTS

| | | |
|---|---|---|
| DE | 10002375 A1 | 4/2001 |
| DE | 10101978 A1 | 7/2002 |
| DE | 10255115 B3 | 7/2004 |
| WO | 0030902 | 6/2000 |

OTHER PUBLICATIONS

Notice of Allowance mailed Jan. 30, 2008 for U.S. Appl. No. 11/145,629, 6 pages.
Notice of Allowance mailed Apr. 8, 2010 for U.S. Appl. No. 12/117,215, 5 pages.
Final Office Action mailed Jan. 12, 2010 for U.S. Appl. No. 12/117,215, 6 pages.
Office Action mailed Jun. 29, 2009 for U.S. Appl. No. 12/117,215, 5 pages.

* cited by examiner

*Primary Examiner* — Ronald W Leja
*Assistant Examiner* — Ann T Hoang

(57) ABSTRACT

A switch arrangement for providing a drive signal at an output comprises a drive switch coupled to the output of the switch arrangement and a regulating element coupled in series between the drive switch and a power supply input of the switch arrangement. The drive switch is operable to provide the drive signal at the output. The switch arrangement is characterized in that the regulating element is coupled in a cascode arrangement with the drive switch such that in operation the regulating element limits the voltage drop across the drive switch to a predetermined level.

20 Claims, 2 Drawing Sheets

*-PRIOR ART-*

SWITCH ARRANGEMENT, INTEGRATED CIRCUIT, ACTIVATION SYSTEM

FIELD OF THE INVENTION

This invention relates to a switch arrangement for providing a drive signal at an output, an integrated circuit and an activation system. More particularly, but not exclusively, the invention relates to a switch arrangement for providing a drive signal for activating an activation element, such as an igniter element.

BACKGROUND OF THE INVENTION

Switch arrangements are used widely in automotive applications. For example, for power switches for driving injector or braking valves (e.g. in ABS systems) and for automotive power supplies. Switch arrangements are also used in automotive activation systems such as an igniter system for airbag deployment and a seat belt pretensioner activation system.

An igniter system comprises an activation element or igniter element which converts electrical energy to heat. Typically, the igniter element, also known as a squib, comprises a hot wire bridge which is heated by a firing signal, for example a firing current of 1-2 Amps (A). In, for example, airbag applications, the heat generated in the igniter element ignites a pyrotechnic material adjacent the igniter element which burns a propellant. This produces gas to inflate the airbag.

A particular concern for automotive manufacturers is the possibility of activation elements activating inadvertently due to a fault. For example, inadvertent activation of an airbag may disturb a driver and possibly cause an accident. Thus, drive circuits used for generating the firing or activation signal are designed to minimise inadvertent activation and to ensure reliable operation. FIG. 1 illustrates a known simplified airbag activation circuit.

FIG. 1 illustrates an igniter element or squib 101 coupled to a drive circuit 103. The drive circuit 103 is implemented in a single Application Specific Integrated Circuit (ASIC) and comprises functionality for generating the firing signal which activates the squib 101. More specifically, the drive circuit 103 comprises a switch arrangement including a high side switch FET (Field Effect Transistor) 105 and a low side switch FET 107. During normal operation, when the airbag is not deployed, the high side FET 105 and the low side FET 107 are both in an off state and no current can flow through the squib. The use of two switch transistors in series provides increased reliability and failure prevention. Particularly, if either one of the switch FETs short circuits, this will not result in an activation of the airbag as the other switch FET will be in the off state.

The high side FET 105 is controlled by a high side control circuit 109 and the low side FET 107 is controlled by a low side control circuit 111. Both control circuits 109 and 111 are coupled to a microprocessor 110 which is connected to one or more crash sensors (not shown), such as an accelerometer, to determine when a particular crash condition is occurring in which an airbag should be deployed. The low side control circuit 111 produces a signal which switches the low side FET 107 off during normal operation and on if the airbag is being activated. The high side control circuit 109 also controls the high side FET 105 to be off during normal operation and on during airbag activation.

For current saving purposes, the high side control circuit 109 is further arranged to control the operation of the high side FET 105 such that it operates in a current limitation mode to limit the current to the squib 101 to the required value, which is typically 1.2 A.

Typically, the same energy supply is used for a plurality of airbags and the current limitation prevents that this energy supply is used up by a short circuit in one airbag. For example, during a crash, the upper squib end may be short circuited to ground. If the current through the high side FET 105 is not limited, the resulting current would become exceedingly high thereby quickly draining the energy supply and possibly preventing the activation of other airbags.

Typically, the drive circuit 103 is not directly connected to the energy supply. Rather, a power switch transistor known as a safing switch 113 is coupled in series with the drive circuit 103. The safing switch 113 is generally an external discrete FET component. The safing switch 113 provides further failure prevention by providing additional redundancy in the airbag activation operation.

Specifically the operation of the safing switch 113 is controlled by a control circuit 115 in response to different sensor inputs than those used for activating the drive circuit. Typically the safing switch 113 is controlled by a completely different microprocessor operating a different crash detection algorithm and with different sensor inputs than for the drive circuit. Thus, the airbag is only activated if both redundant evaluations detect the occurrence of a crash in which case the high side FET 105 and the low side FET 107 of the drive circuit as well as the safing switch 113 are switched on. The safing switch 113 is operated as a simple on/off switch. In some applications, several safing switches are used to provide independent safety switches for different drive circuits. For example, each squib may be provided with its own safing switch.

The safing switch 113 is coupled to a reverse flow blocking diode 117. The reverse flow blocking diode 117 is connected to a capacitor 125 coupled to receive the battery voltage Vbat and which provides the power supply to the drive circuit 103 and squib 101. The capacitor 125 ensures that energy may be provided to the airbag activation system even if the connection to the battery is broken during the crash. However, as the capacitor 125 may be discharged, for example after the car has been switched off for a given duration, an electrical path exists from the upper end of the squib to ground through the capacitor 125 and the parasitic diodes 119, 121, which parasitic diodes are inherent features of FETs. Accordingly, in the absence of the blocking diode 117, a short circuit resulting in a voltage being applied to the lower end of the squib would result in a current flowing through the squib and thereby activating the airbag. The blocking diode effectively breaks this path. The blocking diode may typically be common to a plurality of drive circuits.

A number of disadvantages are associated with the prior art arrangement of FIG. 1.

Firstly, the requirement for an external safing FET tends to increase the cost and complexity of the arrangement. Furthermore, the safing FET tends to be relatively bulky and as the FET is external to the drive circuit, it requires additional operations during manufacturing.

Furthermore, the prior art arrangement results in a significant energy dissipation in the high side FET 105 which accordingly must be relatively large.

Specifically, the energy stored in the reservoir capacitor is given by $$E = \frac{1}{2} C \cdot V^2$$

where C is the capacitance of the capacitor and V is the voltage across the capacitor. Hence, in order to store sufficient energy to ensure that the squib is activated, while maintaining the size and cost of the capacitor acceptably low, it is required that the capacitor is charged to a relatively high voltage. Typically, the capacitor is charged to a voltage of around 35-36 volts (V).

During activation, the low side FET 107 is fully switched on resulting in a typical voltage drop of less than 2V. Furthermore, the impedance of the squib 101 is relatively low resulting in a typical voltage drop of less than 2V. The voltage drop over the blocking diode 117 is typically around 1V. Furthermore, the safing FET 113 is fully switched on during activation resulting in a typical voltage drop of around 1 V (the on resistance of the safing FET 113 is typically lower than that of the low side FET 107). Accordingly, during the current limiting operation of the high side FET 105, the voltage drop from drain to source is typically in the order of 30V. Typically the current is limited to around 1.2 A and the squib is fired in typically 1-2 ms. Therefore, the energy dissipation in the high side FET 105 during activation is around 30V×1.2 A×2 ms=72 milli-Joules (mJ). This energy needs to be absorbed by the high side FET 105 without resulting in a thermal shutdown of the FET. The size of a FET is driven by the amount of energy to be dissipated: the higher the energy, the larger the size of the FET. Thus, in order to meet this energy requirement, it is necessary that the high side FET 105 is physically large.

However the requirement for a large FET has significant impact on the ASIC cost. Furthermore, as the required size depends on the energy absorption requirement, the design cannot take full advantage of the advances in manufacturing technology. For example, as improvements in lithography processing are achieved, smaller transistors can be formed resulting in smaller areas being required to implement circuits. This allows for higher integration and may allow more circuitry to be included in the same ASIC. However, the high side FET cannot be shrunk due to the fact that in operation it is required to dissipate 120 mJ of energy.

There is therefore a need to provide an improved switch arrangement which when used in an activation system mitigates the above problems and disadvantages.

SUMMARY OF THE INVENTION

In accordance with a first aspect of the present invention there is provided a switch arrangement as claimed in claim 1 of the accompanying claims.

In accordance with a second aspect of the present invention there is provided an integrated circuit as claimed in claim 11 of the accompanying claims.

In accordance with a third aspect of the present invention there is provided an activation system as claimed in claim 14 of the accompanying claims.

BRIEF DESCRIPTION OF THE DRAWINGS

A switch arrangement, an integrated circuit and an activation system, in accordance with the present invention will now be described, by way of example only, with reference to the accompanying drawings in which.

DETAILED DESCRIPTION

A switch arrangement in accordance with the present invention will now be described with reference to the use of the switch arrangement in providing a drive signal to activate an activation element such as an igniter element of an airbag system. It is, however, not intended that the invention be limited to such an application and it will be appreciated that the switch arrangement in accordance with the present invention may also be used to provide a drive signal to activate other activation elements such as a seat belt pretensioner activation element in a vehicle. The switch arrangement in accordance with the present invention may also be used in a power switch arrangement and power supply arrangements, particularly for automotive applications where voltages of over 35V are not untypical.

Thus, in summary, the switch arrangement in accordance with the present invention will be useful in high voltage applications requiring a switch to provide a drive signal for activating an activation element.

Figure 2:
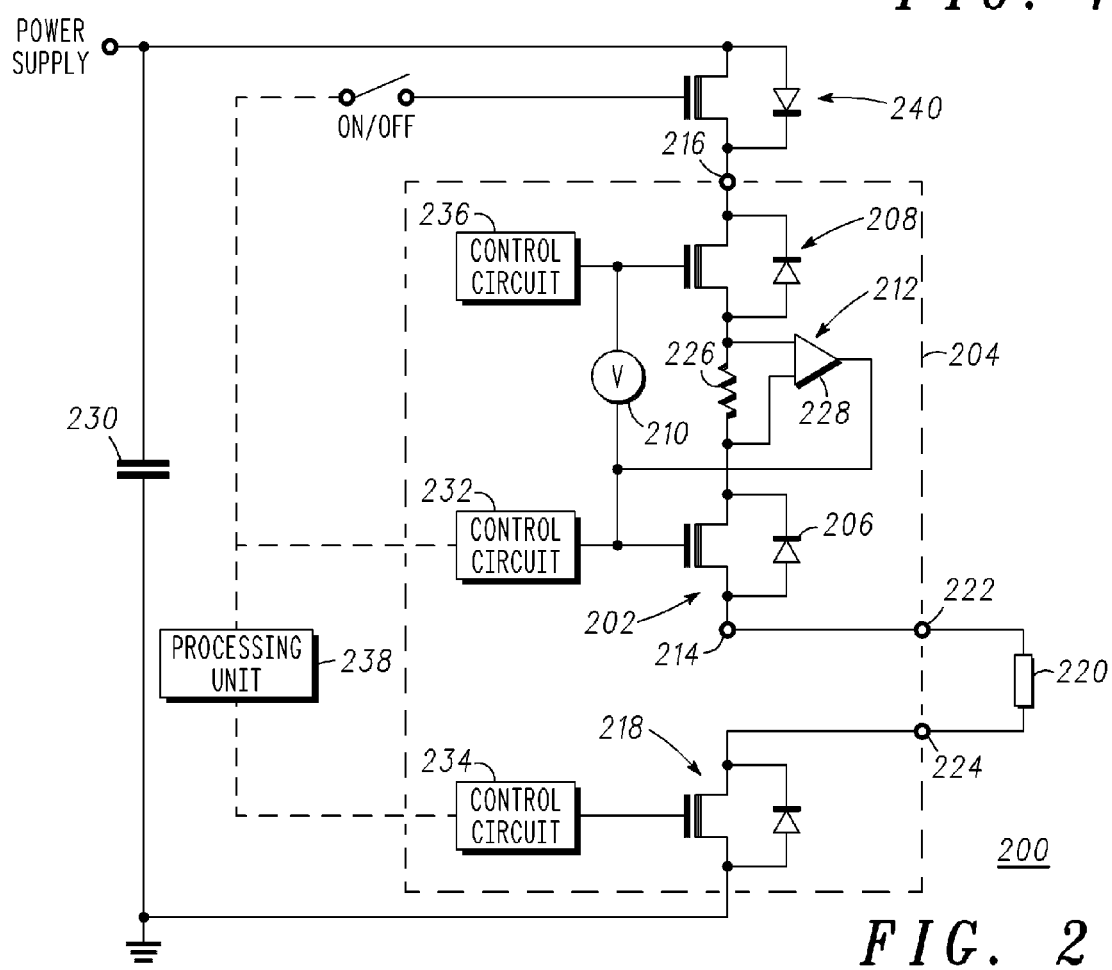
FIG. 2 is a simplified schematic circuit diagram of an airbag activation circuit comprising a switch arrangement in accordance with the present invention.

Referring to FIG. 2, a switch arrangement 202 in accordance with the present invention is shown as part of a drive circuit 204 of an airbag activation system 200. The airbag activation system 200 comprises an igniter element or squib 220 coupled to the drive circuit 204.

The switch arrangement 202 comprises a drive switch 206 coupled to an output 214 of the switch arrangement 202 and a regulating element 208 coupled in series between a power supply input 216 of the switch arrangement and the drive switch 206. The regulating element 208 is coupled in a cascode arrangement with the drive switch 206 such that in operation the regulating element limits the voltage drop across the drive switch 206 to a predetermined level. The output 214 of the switch arrangement 202 is coupled to a first output 222 of the drive circuit 204 which is coupled to one side of the squib 220. The drive circuit 204 is operable to generate a drive signal at the output 214 of the switch arrangement 202 which may activate the squib 220.

The switch arrangement 202 further comprises a voltage source 210 coupled to the drive switch 206 and the regulating element 208. The voltage source 210 provides a voltage signal to control the operation of the regulating element 208 and the drive switch 206 such that in operation the level of the voltage signal provided by the voltage source 210 determines the predetermined level of the voltage drop across the drive switch 206. The level of the voltage signal may be selected during the design of the circuit and may vary from −10 volts to 10 volts (the range depending on the technology used). The voltage source 210 may also be arranged such that the level of the voltage signal provided by the voltage source 210 may be varied in operation of the switch arrangement 202. The variation may be based on time, voltage levels and/or temperature. In the case when the voltage level is selected to be zero, the control electrodes of the drive switch 206 and the regulating element 208 are effectively shorted.

In the preferred embodiment, the drive switch 206 of the switch arrangement 202 forms the high side FET switch 206 of the airbag drive circuit 204 and the regulating element 208 comprises a FET device 208. The regulating FET device 208 may also form a safing switch for the airbag activation system 200.

The drive circuit 204 further comprises a low side FET switch 218 having a drain electrode coupled to a second output 224 of the drive circuit 204 which is coupled to the other side of the squib 220 and a source electrode coupled to ground. The low side FET switch 218 may be operated and designed in the same way as for the prior art arrangement of FIG. 1.

The high side FET switch 206 is controlled by a high side control circuit 232, the low side FET switch 218 is controlled by a low side control circuit 234 and the regulating FET device 208 is controlled by a regulating control circuit 236.

Both control circuits 232 and 234 are coupled to a processing unit 238, such as the main microprocessor for the airbag system, which is connected to one or more crash sensors (not shown), such as an accelerometer, to determine when a particular crash condition is occurring in which an airbag should be deployed. The low side control circuit 234 produces a signal which switches the low side FET switch 218 off during normal operation and on if the airbag is being activated. The high side control circuit 232 also controls the high side FET switch 206 to be off during normal operation and on during airbag activation.

In the preferred embodiment the regulating FET device 208 operates as a safing switch. The regulating control circuit 236 is thus coupled to a completely different processing unit (not shown) operating a different crash detection algorithm and with different sensor inputs than the processing unit 238 for the high side FET switch 206 and the low side FET switch 218. Thus, the airbag is only activated if both redundant evaluations detect the occurrence of a crash in which case the high side FET switch 206 and the low side FET switch 218 as well as the regulating FET device 208 are switched on.

The high side FET switch 206 and the regulating FET device 208 are coupled in a cascode arrangement wherein the control electrodes (ie. gate electrodes) of the high side FET switch 206 and the regulating FET device 208 are coupled together via the voltage source 210 and the current electrodes are coupled in series. The drain electrode of the regulating FET device 208 is coupled to the power supply input 216, the source electrode of the regulating FET device 208 is coupled to the drain electrode of the high side switch FET 206 and the source electrode of the high side switch FET 206 is coupled to the output 214 of the switch arrangement 202.

In a preferred embodiment, the switch arrangement 202 comprises a current limiting means 212 in order to limit the current at the output 214 of the switch arrangement 202 and therefore to limit the current provided to the squib 220 to a predetermined level required to activate the squib 220. The current limiting means 212 is coupled to sense the current at the output 214 of the switch arrangement 202 and comprises a feedback output that is coupled to the control inputs of the high side FET switch 206 and the regulating FET device 208. In the preferred embodiment shown in FIG. 2, the current limiting means 212 comprises a sense resistor 226 coupled to the source electrode of the regulating FET device 208 and the drain electrode of the high side FET switch 206 and an amplifier 228 acting as a voltage detecting means to detect the voltage level across the sense resistor 226. The feedback output of the current limiting means 212 comprises an output of the amplifier which is coupled to the gate electrode of the high side switch 206 and the voltage source 210.

In operation, the amplifier 228 senses the voltage across the sense resistor 226 and when the voltage level across the sense resistor 226 exceeds a threshold level, the feedback signal provided at the output of the amplifier 228 controls the level of the voltage signal applied to the gate electrodes of the high side FET switch 206 and the regulating FET device 208 to limit the current through the sense resistor 226 and hence the current at the output 214 of the switch arrangement 202 to the predetermined level. The extent to which the feedback signal affects one or both of the high side FET switch 206 and the regulating FET device 208 depends on the level of the voltage signal provided by the voltage source 210. Depending on the voltage level provided by the voltage source 210, the feedback signal drives one or both of the high side FET switch 206 and the regulating FET device 208 into the saturated mode/ linear mode of FET operation when the voltage level across the sense resistor 226 exceeds the threshold voltage.

In the preferred embodiment, the predetermined level is at a minimum 1.2 A and the threshold level for the voltage across the sense resistor 226 is chosen to ensure that the current always exceeds the predetermined level of 1.2 A while being as low as possible to limit energy waste and power dissipation.

The current limiting means 212 may be implemented in other ways. For example, the FET switching device 206 may comprise a sense FET and the sense FET may be used such that part of the FET switching device 206 is used to sense and control the current at the output of the switching device.

The airbag activation system further comprises a reservoir capacitor 230 coupled between a power supply such as a vehicle battery and ground and a reverse blocking diode 240 coupled between the power supply and the power supply input 216 of the switch arrangement 202. The reservoir capacitor 230 is a reservoir of energy and provides a high voltage to the power supply input 216 of the drive circuit 204. The reverse blocking diode 240 comprises a reverse blocking FET switch 240 having a drain electrode coupled to the power supply, a source electrode coupled to the drain electrode of the regulating FET device 208 and a gate electrode coupled to receive an on/off signal from, for example, the processing unit 238. In some applications, the gate electrode of the reverse blocking FET switch 240 may be connected to its source electrode such that the reverse blocking FET switch 240 operates as a pure diode. The reverse blocking FET switch 240 is used to avoid discharge of the reservoir capacitor 230 through the squib 220 and the parasitic diodes of the series connected FET devices (208, 206) when the airbag is not deployed.

The operation of the switch arrangement 202 in accordance with the present invention will now be described with reference to the operation of the airbag activation system 200.

During normal operation when the airbag is not deployed, the high side FET switch 206 and the low side FET switch 218 are both controlled by the control circuits 232 and 234 to be in an off state. The regulating FET device 208 and the reverse blocking FET switch 240 are also controlled to be in an off state. No current flows through the squib 220. The reverse blocking FET switch 240 is arranged to be in an off state when the power supply is lower than the battery voltage. Once the power supply is greater than the battery voltage, the state of the reverse blocking FET switch 240 (i.e. on or off) does not matter.

In the following description, the following activation requirements are used. A drive signal of 1.2 A is required at the first output 222 of the drive circuit 204 for 2 ms in order to activate the squib 220. The squib 220 has a load resistance of 1 ohm. The threshold level for the voltage across the sense resistor 226 of the current limiting means 212 is therefore set to limit the current to 1.2 A. It will however be appreciated that other values may also be used.

When the crash sensors (not shown) detect that a crash has occurred, the processing unit 238 outputs a signal to the low side control circuit 234 in response to which the low side control circuit 234 provides a high voltage signal to the gate electrode of the low side FET switch 218. The high voltage signal drives the low side FET switch 218 into the non-saturated operating region (or full rdson mode) such that the low side FET switch 218 is driven to provide a resistive load having a low value Rdson.

A high voltage signal can also be provided to the gate electrode of the reverse flow blocking diode 240 so as to drive it into the non-saturated operating region.

When a crash has been detected, the processing unit 238 also outputs a signal to the high side control circuit 232 in response to which the high side control circuit 232 provides a voltage signal to the gate electrode of the high side FET switch 206. The operation of the high side FET switch 206 depends on the level of the voltage signal provided by the voltage source 210.

Similarly, when a crash is detected, a different processing unit (not shown) provides a signal to the regulating control circuit 236 in response to which the regulating control circuit 236 provides a voltage signal to the gate electrode of the regulating FET device 208. The operation of the regulating FET device 208 depends on the level of the voltage signal provided by the voltage source 210.

The operation of the high side FET switch 206 and the regulating FET device 208 will now be described for three different voltage levels, −10 v, zero volts and +10 v, provided by the voltage source 210. For all three examples, the following assumptions are used:

Voltage provided at power supply input 216 is 35V
Rdson of the low side FET switch 218 is 1 ohm
Resistance of the sense resistor 226 is 50 mohms
Resistance of the squib 220 is 1 ohm
Current limitation is 1.2 A
Rdson of the high side FET switch 206 is 1 ohm
Gate-source voltage Vgs of high side FET switch 206 is 2V@1.2 A when high side FET switch 206 is operating in saturated region and this value of Vgs is determined by the geometry and selected technology used in the manufacture of the FET switch 206.
Gate-source voltage Vgs of regulating FET device 208 is 1.8V@1.2 A when regulating FET device 208 is operating in saturated region and this value of Vgs is determined by the geometry and selected technology used in the manufacture of the regulating FET device 208.

Voltage Source 210=−10 Volts

When a crash has been detected, the high side control circuit 232 provides a voltage signal to the gate electrode of the high side FET switch 206 which together with the voltage source 210 drives the high side FET switch 206 into the non-saturated operating mode. The high side FET switch 206 is therefore driven to provide a resistive load having a low value Rdson of 1 ohm. With the low side FET switch 218 operating in the non-saturated region and having a resistance of 1 ohm also, the voltage required at the first output of the drive circuit 222 (i.e. the voltage at the source electrode of high side FET switch 206) is 2.4V. The voltage at the drain electrode of the high side FET switch 206 is 3.6V and the voltage at the source electrode of the regulating FET device 208 is 3.66V.

The regulating control circuit 236 provides a voltage signal to the gate electrode of the regulating FET device 208 so as to drive the regulating FET device 208 into the saturated operating mode (or regulating mode) so that the regulating FET device 208 operates in the active region so as to provide a voltage drop during activation of the squib 220. Thus, since Vgs of the regulating FET device 208 is 1.8V, the voltage at its gate is 5.46V. With the level of voltage provided by the voltage source 210 being −10V, the voltage at the gate of the high side FET switch 206 is therefore 15.46V.

Figure 1:
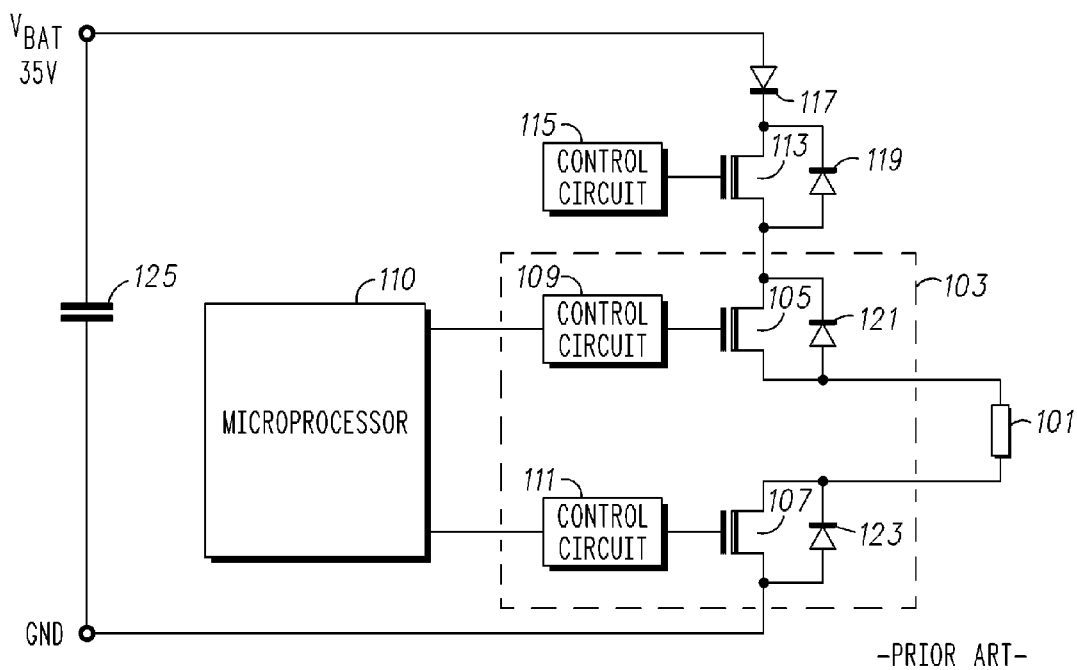
FIG. 1 is a simplified schematic circuit diagram of a prior art airbag activation circuit.

In this example, the voltage drop across the high side FET switch 206 is therefore 1.2V and so the amount of energy to be dissipated by the high side FET switch 206 is 2.88 mJ (assuming a drive signal of 1.2 A for 2 ms) compared with 72 mJ of the prior art arrangement shown in FIG. 1. In other words, in the example just described, the energy dissipation of the high side FET switch 206 is reduced by a factor of 25.

The voltage drop across the regulating FET device 208 is 31.34V. Thus, a large proportion of the energy due to the high voltage at the power supply input 216 must be dissipated by the regulating FET device 208.

Voltage Source 210=Zero Volts

When a crash has been detected, the high side control circuit 232 provides a voltage signal to the gate electrode of the high side FET switch 206 which drives the high side FET switch 206 into an operating mode in between the non-saturated operating mode and the saturated operating mode. The gate voltage is regulated such that the voltage drop across the high side FET switch 206 (i.e. the drain-source voltage Vds) together with the voltage drop across the sense resistor 226 is equal to the gate-source voltage across the high side FET switch 206 (Vgs206) minus the gate-source voltage across the regulating FET device 208 (Vgs208).

The regulating control circuit 236 provides a voltage signal to the gate electrode of the regulating FET device 208 which together with the voltage provided to the gate electrode of the high side FET switch 206 drives the regulating FET device 208 into the saturated operating mode so that the regulating FET device 208 operates in the active region so as to provide a voltage drop during activation of the squib 220.

In this example, the voltage drop across the high side FET switch 206 is typically between 3V and 6V and so the amount of energy to be dissipated by the high side FET switch 206 is between 7.2 mJ and 14.4 mJ (assuming a drive signal of 1.2 A for 2 ms) compared with 72 mJ of the prior art arrangement shown in FIG. 1.

Voltage Source 210=+10 Volts

When a crash has been detected, the high side control circuit 232 provides a voltage signal to the gate electrode of the high side FET switch 206 which together with the voltage source 210 drives the high side FET switch 206 into the saturated operating mode. The high side FET switch 206 is therefore driven such that the voltage on its gate electrode is 2V above its source electrode i.e. at 4.4V.

The regulating control circuit 236 provides a voltage signal to the gate electrode of the regulating FET device 208 which together with the voltage signal provided by the voltage source 210 and voltage on the gate electrode of the high side FET switch 206 drives the regulating FET device 208 into the saturated operating mode so that the regulating FET device 208 operates in the active region so as to provide a voltage drop during activation of the squib 220. The regulating FET device 208 is driven such that the voltage on its gate electrode is 14.4V. Thus, since Vgs of the regulating FET device 208 is 1.8V, the voltage at its source electrode is 12.6V.

In this example, the voltage drop across the high side FET switch 206 is therefore 10.14V and so the amount of energy to be dissipated by the high side FET switch 206 is 24.34 mJ (assuming a drive signal of 1.2 A for 2 ms) compared with 72 mJ of the prior art arrangement shown in FIG. 1. In other words, in the example just described, the energy dissipation of the high side FET switch 206 is reduced by a factor of just under 3.

The voltage drop across the regulating FET device 208 is 22.4V. Thus, a large proportion of the energy due to the high voltage at the power supply input 216 must be dissipated by the regulating FET device 208.

Thus, in the switch arrangement 202 in accordance with the present invention, coupling the regulating FET device 208 in a cascode arrangement with the high side FET switch 206 ensures that the voltage drop across the high side FET switch 206 can be limited to a predetermined level. For the three examples, discussed above, the voltage drop does not exceed 10.14V. The present invention allows for a significant amount of the energy to be dissipated across the regulating FET device 208 rather than across the high side FET switch 206.

Since the high side FET switch is therefore required to dissipate significantly less energy than the prior art arrangement, the high side FET switch for the switch arrangement in accordance with the preferred embodiment may be significantly smaller than the prior art high side switch.

Furthermore, since the voltage rating for the high side FET switch is 10V and so significantly less than for the prior art high side switch of 40V, this leads to a significant reduction of the FET size when sized for Rdson. The Rdson of a device is proportional to the square of the voltage rating. Thus, the present invention leads to a reduction of up to a factor of 20.

Since the size of the high side switch of the switch arrangement in accordance with the preferred embodiment is less dependent on the energy requirements and more on the Rdson requirements, the present invention can benefit from new generations of technology which enable the size of devices to be shrunk. Thus, as the size of the high side switch can be shrunk with new generations of technology, the cost of its manufacture is reduced. Also, as the size of the die required to implement the switch arrangement in accordance with the present invention is reduced, this opens up the possibilities to integrate additional functions with the high side switch, such as a power supply, the safing microprocessor or other functions need for an airbag activation system, without increasing the overall size and cost.

In the preferred embodiment, a single regulating transistor is used to regulate the voltage drop across the drive switch or high side FET switch and also to act as a safing switch. Dissipating the majority of the energy in the regulating transistor or safing switch does not increase the cost of the safing switch. The safing switch is preferably implemented in a less critical technology where the increased power requirement is of less significance. For example, the regulating FET device acting as a safing switch may be implemented as a discrete FET.

As mentioned above, the level of the voltage signal provided by the voltage source 210 may be varied during operation of the switch arrangement 202 over time, voltage levels and/or temperature. Varying the voltage level may be used to balance the power between the high side FET switch 206 and the regulating FET device 208. For example, by varying the voltage level over time, the power dissipated in the high side FET switch 206 may be varied. As an increase in the temperature of a FET device depends on its thermal impedance (which varies with time from 0 to a steady state value), there may be an advantage in varying the level of the voltage signal provided by the voltage source 210 to the high side FET switch 206 to account for the change in its thermal impedance. A feedback loop including means for monitoring the temperature of the high side FET switch 206 may be used to control the level of the voltage signal.

In the preferred embodiment the high side FET switch 206 is integrated with the low side FET switch 218 on the same semiconductor die. The control circuits 232 and 234, and current limiting means 212 may also be integrated on the same die as the high and low side FET switches. The regulating FET device 208 is integrated on a separate die.

Figure 3:
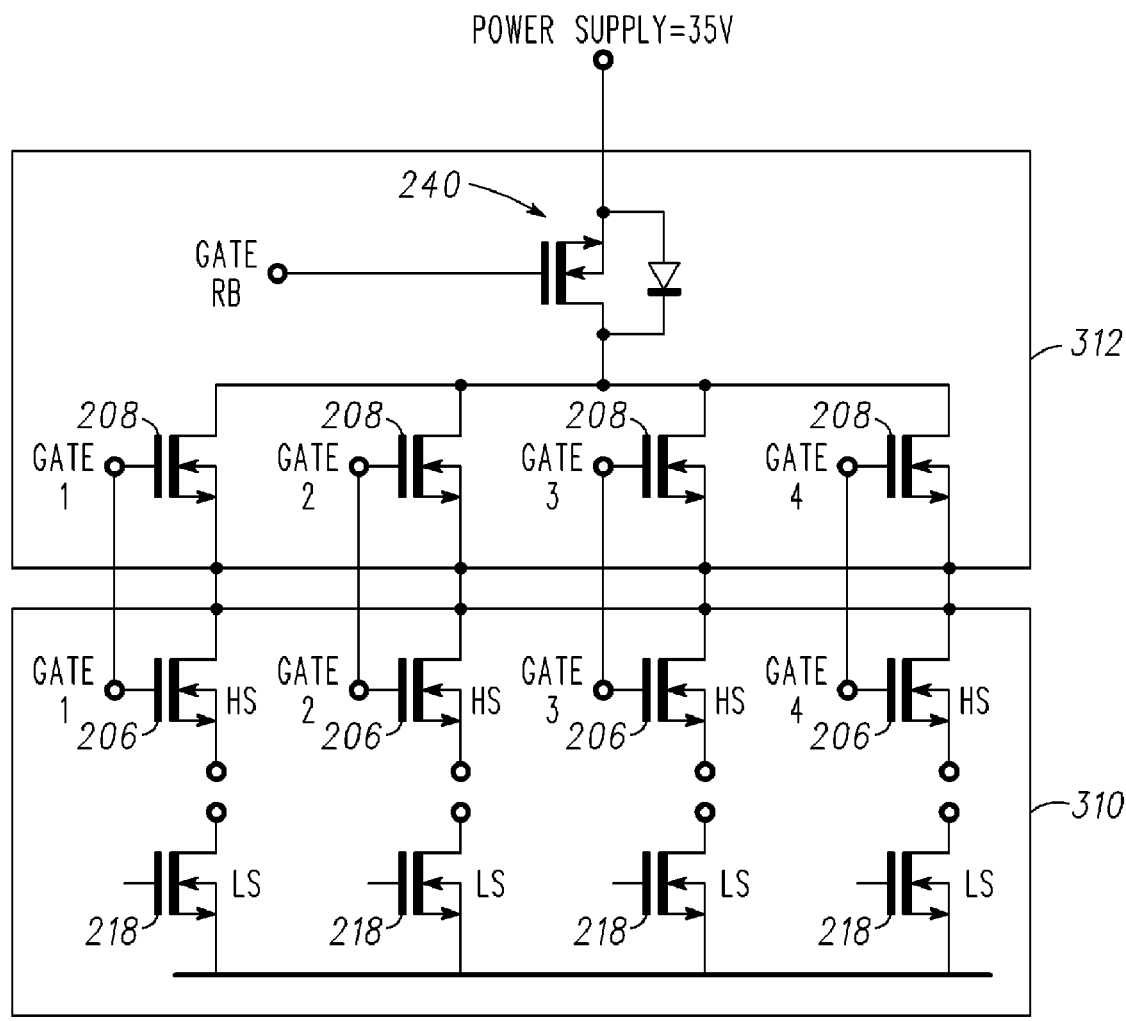
FIG. 3 is a schematic diagram of a plurality of drive circuits comprising the switch arrangement in accordance with the present invention for a plurality of airbag igniter elements in an airbag activation system.

FIG. 3 illustrates four high side and low side FET switches for driving four squibs (not shown). All the high side and low side FET switches are integrated on die 310 and all the regulating FET devices 208 are integrated on die 312. In the embodiment shown in FIG. 3, the voltage source 210 is zero and as can be seen the gate electrodes of the high side FET switch 206 and the regulating FET device 208 are shorted.

The reverse blocking FET switch 240 may be coupled to any number of regulating FET devices 208. In FIG. 3, one reverse blocking FET switch 240 is coupled to the drain electrodes of the four regulating FET devices 208.

The semiconductor dies 310 and 312 may be integrated in one package or in separate packages. When integrated in one package, the dies are supported by separate flags (not shown) or electrically isolating glue is used to ensure isolation between the dies. Alternatively, the regulating FET device 208 may be realised by a discrete MOSFET device.

An advantage of implementing the high side FET switch 206 and the regulating FET device 208 on separates dies is that different technologies can be used in implementing each circuit. Thus, the first die 310 may be optimised for the requirements and characteristics of the high side FET switch and the second die 312 may be optimised for the requirements and characteristics of the regulating FET device 208.

Specifically, the first die 310 may utilise a more complex technology which is relatively expensive to manufacture but which allows low dimension and thus high integration compared to the technology used for manufacturing the second die 312. For example, the first die may be manufactured using a SMARTMOS technology developed by Freescale Semiconductor Inc. and the second die may be manufactured using simpler and cheaper technology, such as a vertical discrete MOSFET technology like HDTMOS technology.

Thus, the advantages of the more complex technology may be used to provide high integration and additional functionality for the switch arrangement and drive circuit and the cheaper technology may be used for the regulating FET device, which due to the energy dissipation requirements, is required to be a larger device.

Typically, the reverse blocking diode is implemented using a discrete component due to the high energy requirements of the diode. However, since the regulating FET device 208 is required to dissipate large amounts of energy, in the preferred embodiment the reverse blocking FET switch 240 is integrated on the same die 312 as the regulating FET devices 208. By integrating the reverse blocking FET switch 240 on the same die as the regulating FET device or safing switch, the reverse block FET switch is integrated at very modest cost which saves cost and also, space on the printed circuit board.

In the example shown in FIG. 3 above, part of four drive circuits are shown for driving four squibs (not shown). Each drive circuit comprises a dedicated regulating FET device 208. In an activation system which uses non-overlapping firing sequences, a single regulating FET device 208 may be used for a plurality of drive circuits. In this latter case, the outputs of the voltage sources 210 of the plurality of drive circuits are multiplexed to provide the control voltage to the single regulating FET device 208. It will be appreciated that multiplexing for the inputs/outputs of the other components of the drive circuits may also be required to implement the invention with a single regulating FET device 208. Such an arrangement further reduces the number of external components in systems using non-overlapping firing sequences.

The switch arrangement 202 in accordance with the preferred embodiment has been described as comprising FET devices operating in saturated or non-saturated regions but it will be appreciated that other transistor types, such as bipolar transistors operating in active or saturated regions, may alternatively or additionally be used.

The invention claimed is:

1. A switch arrangement for providing a drive signal at an output, the switch arrangement comprising:
   a drive switch coupled to the output of the switch arrangement, the drive switch being operable to provide the drive signal at the output;
   a regulating element coupled in series between the drive switch and a power supply input of the switch arrangement, wherein the regulating element is coupled in a cascode arrangement with the drive switch; and
   a voltage source operable to provide a reference voltage across a first terminal and a second terminal thereof, wherein the first terminal is coupled to a control input of the drive switch and the second terminal is coupled to a control input of the regulating element for providing a voltage signal to the control inputs to control the operation of the regulating element and the drive switch such that in operation the regulating element limits the voltage drop across the drive switch to a predetermined level which is determined by the level of the voltage signal provided by the voltage source.

2. The switch arrangement according to claim 1 wherein the level of the voltage signal provided by the voltage source may be positive, negative or zero volts.

3. The switch arrangement according to claim 1 wherein the drive switch comprises a first transistor and the regulating element comprises a second transistor coupled in series with the first transistor, each of the first and the second transistors having a control electrode, and wherein the voltage source is coupled between the control electrodes of the first and the second transistors.

4. The switch arrangement according to claim 3 wherein the first and second transistors each have first and second current electrodes, wherein the first current electrode of the second transistor is coupled to the power supply input, the second current electrode of the second transistor is coupled to the first current electrode of the first transistor and the second current electrode of the first transistor is coupled to the output of the switch arrangement.

5. The switch arrangement according to claim 1 further comprising a current limiter for limiting a current provided at the output of the switch arrangement.

6. The switch arrangement according to claim 5 wherein the current limiter is coupled to sense the current at the output of the switch arrangement and comprises a feedback output coupled to the control inputs of the regulating element and drive switch such that the current limiter is operable to limit the current at the output of the switch arrangement to a predetermined level by controlling a voltage signal applied to the control inputs of the drive switch and regulating element.

7. The switch arrangement according to claim 5 wherein the current limiter comprises:
   a sense resistor coupled between the second transistor and the first transistor; and
   voltage detector for detecting the level of voltage across the sense resistor and for providing a feedback signal at a feedback output, the feedback output being coupled to the control electrode of the first transistor, the voltage detector being operable to provide a feedback signal to control the level of the voltage signal applied to the control electrodes of the first and second transistors to limit the current at the output of the switch arrangement to the predetermined level when the voltage across the sense resistor is detected to reach a threshold level.

8. An integrated circuit comprising the switch arrangement according to claim 5 wherein the drive switch is disposed on a first die and the regulating element is disposed on a second die.

9. An integrated circuit according to claim 8 wherein the voltage source is disposed on the first die.

10. An integrated circuit according to claim 8 wherein the current limiter is disposed on the first die.

11. An integrated circuit according to claim 8 wherein the drive switch comprises a first transistor and the regulating element comprises a second transistor coupled in series with the first transistor, each of the first and the second transistors having a control electrode, and wherein the voltage source is coupled between the control electrodes of the first and the second transistors.

12. An integrated circuit according to claim 8 further comprising:
   a reverse blocking switch transistor coupled in series between the power supply input and the regulating element.

13. The switch arrangement according to claim 1 further comprising:
   a reverse blocking switch transistor coupled in series between the power supply input and the regulating element.

14. The switch arrangement according to claim 1 wherein the drive switch comprises a high side switch and the regulating element comprises a transistor device coupled in series with the high side switch.

15. An activation system comprising:
   an activation element; and
   a switch arrangement according to claim 1, wherein the output of the switch arrangement is coupled in series with the activation element, the switch arrangement being arranged to provide in operation a drive signal at the output to activate the activation element.

16. The activation system according to claim 15 wherein the drive switch comprises a first transistor and the regulating element comprises a second transistor coupled in series with the first transistor, each of the first and the second transistors having a control electrode, and wherein the voltage source is coupled between the control electrodes of the first and the second transistors.

17. An activation system comprising:
   a plurality of activation elements; and
   a plurality of switch arrangements according to claim 1, wherein each one of the plurality of switch arrangements is coupled to an associated activation element of the plurality of activation elements.

18. The activation system of claim 17 further comprising:
   a power supply; and
   a reverse blocking switch transistor coupled in series between the power supply and the regulating element of each of the plurality of switch arrangements.

19. The activation system according to claim 17 wherein the drive switch comprises a first transistor and the regulating element comprises a second transistor coupled in series with the first transistor, each of the first and the second transistors having a control electrode, and wherein the voltage source is coupled between the control electrodes of the first and the second transistors.

20. The switch arrangement according to claim 1 wherein:
the control input of the drive switch is further coupled to a first control circuit; and
the control input of the regulating element is further coupled to a second control circuit.

* * * * *